US012597898B2

(12) United States Patent
Yamashita et al.

(10) Patent No.: US 12,597,898 B2
(45) Date of Patent: Apr. 7, 2026

(54) HIGH-FREQUENCY CIRCUIT AND COMMUNICATION DEVICE

(71) Applicant: Murata Manufacturing Co., Ltd., Kyoto (JP)

(72) Inventors: Takahiro Yamashita, Kyoto (JP); Masakazu Hirobe, Kyoto (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 556 days.

(21) Appl. No.: 18/162,875

(22) Filed: Feb. 1, 2023

(65) Prior Publication Data

US 2023/0179157 A1 Jun. 8, 2023

Related U.S. Application Data

(63) Continuation of application No. PCT/JP2021/028579, filed on Aug. 2, 2021.

(30) Foreign Application Priority Data

Aug. 12, 2020 (JP) ................................. 2020-136491
Feb. 18, 2021 (JP) ................................. 2021-024664

(51) Int. Cl.
| | |
|---|---|
| *H03F 3/60* | (2006.01) |
| *H03F 3/24* | (2006.01) |
| *H03F 3/45* | (2006.01) |

(52) U.S. Cl.
CPC ................. *H03F 3/60* (2013.01); *H03F 3/24* (2013.01); *H03F 3/45* (2013.01)

(58) Field of Classification Search
CPC ..... H03F 3/60; H03F 3/24; H03F 3/45; H03F 2200/451; H03F 2200/534;

(Continued)

(56) References Cited

U.S. PATENT DOCUMENTS 7,961,063 B2  6/2011  Liu et al.
8,164,387 B1 *  4/2012  Apel ..................... H03F 3/3076
                                                        330/276

(Continued)

FOREIGN PATENT DOCUMENTS

CN           107046407 A       8/2017
JP         2003-338724 A      11/2003

(Continued)

OTHER PUBLICATIONS

International Search Report for PCT/JP2021/028579 dated Sep. 14, 2021.

*Primary Examiner* — Hieu P Nguyen
(74) *Attorney, Agent, or Firm* — McDonald Hopkins LLC

(57) ABSTRACT

To provide a high-frequency circuit and a communication device by which a harmonic component in differential amplification can be attenuated. The high-frequency circuit includes a differential amplifier circuit. The differential amplifier circuit includes a first amplifying element, a second amplifying element, first wiring, second wiring, and a series circuit. The first amplifying element includes a first input terminal and a first output terminal. The second amplifying element includes a second input terminal and a second output terminal. The first wiring is connected to the first output terminal. The second wiring is connected to the second output terminal. The series circuit is connected between the first wiring and the second wiring. The series circuit includes a first inductor, a second inductor, and a capacitor.

19 Claims, 8 Drawing Sheets

(58) Field of Classification Search
CPC .. H03F 2200/537; H03F 1/3211; H03F 3/602;
H03F 3/45475; H03F 1/565; H03F 3/195;
H03F 3/245; H03H 2007/013; H04B 1/04
USPC ........................................ 330/252–261, 302
See application file for complete search history.

(56) References Cited

U.S. PATENT DOCUMENTS

| | | | |
|---|---|---|---|
| 9,866,196 B2 * | 1/2018 | Gorbachov ............. | H03F 1/565 |
| 9,923,530 B2 * | 3/2018 | Kao ........................ | H03H 7/40 |
| 2003/0201846 A1 | 10/2003 | Nakamura et al. | |
| 2014/0227988 A1 | 8/2014 | Sato et al. | |
| 2017/0149394 A1 | 5/2017 | Kao et al. | |
| 2022/0060158 A1 | 2/2022 | Koya et al. | |

FOREIGN PATENT DOCUMENTS

| | | | |
|---|---|---|---|
| JP | 2014-155171 A | 8/2014 | |
| JP | 2020-028108 A | 2/2020 | |
| WO | 00/07296 B1 | 2/2000 | |

* cited by examiner

HIGH-FREQUENCY CIRCUIT AND COMMUNICATION DEVICE

CROSS REFERENCE TO RELATED APPLICATION

This is a continuation of International Application No. PCT/JP2021/028579 filed on Aug. 2, 2021 which claims priority from Japanese Patent Application No. 2020-136491 filed on Aug. 12, 2020 and Japanese Patent Application No. 2021-024664 filed on Feb. 18, 2021. The contents of these applications are incorporated herein by reference in their entireties.

BACKGROUND ART

Technical Field

The present disclosure generally relates to a high-frequency circuit and a communication device and more particularly to a high-frequency circuit and a communication device that include a differential amplifier circuit.

Conventionally, a power amplification module to convert a single-ended signal into a pair of differential signals and to carry out amplification has been known (refer to Patent Document 1).

The power amplification module of Patent Document 1 includes a first transformer, a first amplifier circuit, a second amplifier circuit, and a second transformer. The first transformer converts a single-ended signal into a pair of differential signals in the first transformer. The first amplifier circuit amplifies power of one signal of the pair of differential signals. The second amplifier circuit amplifies power of the other signal of the pair of differential signals. The second transformer generates a single-ended signal with use of the signal amplified by the first amplifier circuit and the signal amplified by the second amplifier circuit and outputs the single-ended signal.

Patent Document 1: Japanese Unexamined Patent Application Publication No. 2020-28108

BRIEF SUMMARY

As for power amplification modules (high-frequency circuits) that carry out differential amplification as in Patent Document 1, no consideration is given to a harmonic component.

The present disclosure provides a high-frequency circuit and a communication device by which the harmonic component in the differential amplification can be attenuated.

A high-frequency circuit according to an aspect of the present disclosure includes a differential amplifier circuit. The differential amplifier circuit includes a first amplifying element, a second amplifying element, first wiring, second wiring, and a series circuit. The first amplifying element includes a first input terminal and a first output terminal. The second amplifying element includes a second input terminal and a second output terminal. The first wiring is connected to the first output terminal. The second wiring is connected to the second output terminal. The series circuit is connected between the first wiring and the second wiring. The series circuit includes a first inductor, a second inductor, and a capacitor.

A communication device according to an aspect of the present disclosure includes the above-described high-frequency circuit and a signal processing circuit to which the high-frequency circuit is connected.

According to the present disclosure, the harmonic component in the differential amplification can be attenuated.

DETAILED DESCRIPTION

Figure 1:
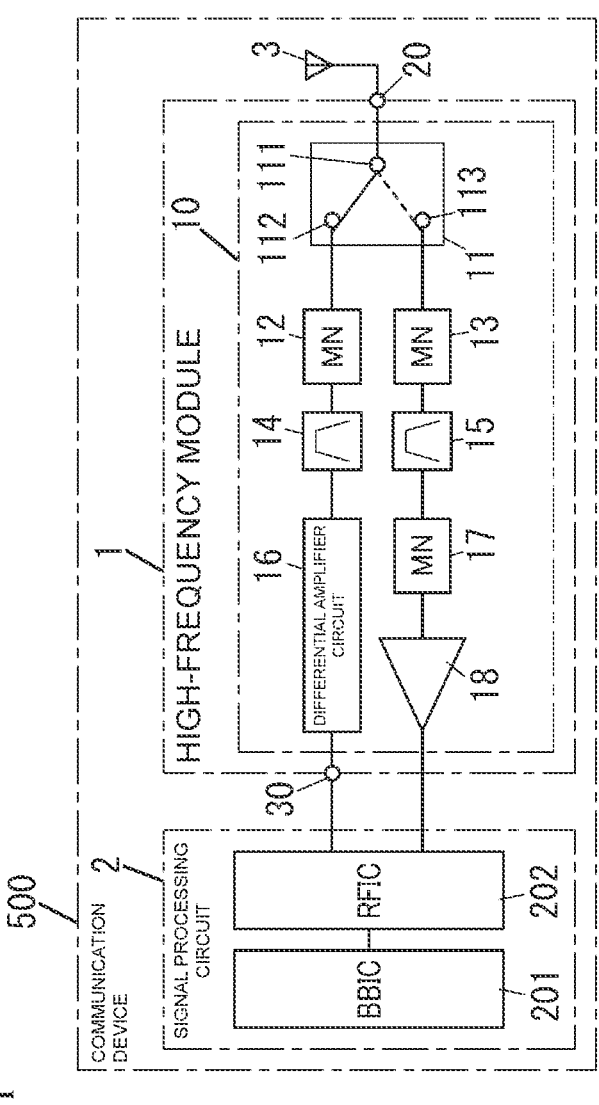
FIG. 1 is a circuit diagram illustrating a configuration of a communication device including a high-frequency circuit according to an embodiment.

All of FIGS. 6 to 9C to be referred to in an embodiment below and the like are schematic drawings and ratios of sizes and thicknesses of components in the drawings do not necessarily reflect actual dimensional ratios.

Embodiment

Hereinbelow, a high-frequency module 1 according to an embodiment and a communication device 500 including the high-frequency module 1 will be described with use of FIGS. 1 to 7B.

(1) High-Frequency Module

As illustrated in FIG. 1, the high-frequency module 1 according to the embodiment includes a high-frequency circuit 10 and an antenna terminal 20.

The high-frequency module 1 according to the embodiment is used for the multimode/multiband-capable communication device 500, for instance. As illustrated in FIG. 1, the communication device 500 includes the high-frequency module 1, a signal processing circuit 2, and an antenna 3. The communication device 500 is a cellular phone (such as smartphone), for instance, but may be a wearable terminal (such as smart watch), for instance, or the like without necessarily being limited thereto. The high-frequency module 1 is a module that is compatible with fourth generation mobile communication system (4G) standards, fifth generation mobile communication system (5G) standards, or the like, for instance. An example of the 4G standards is third generation partnership project (3GPP) long term evolution (LTE) standards. An example of the 5G standards is 5G new radio (NR).

The high-frequency module 1 according to the embodiment carries out communication in a mid-band frequency band. On condition that 4G communication is carried out in the embodiment, Band4 (transmission band of 1710 MHz to 1755 MHz, reception band of 2110 MHz to 2155 MHz) is used as the mid-band frequency band specified in 4G, for instance. On condition that 5G communication is carried out, n1 (frequency band of 1920 to 1980) is used as the mid-band frequency band specified in 5G, for instance.

(2) Components of High-Frequency Module

Hereinbelow, components of the high-frequency module 1 according to the embodiment will be described with reference to the drawings.

As described above, the high-frequency module 1 includes the high-frequency circuit 10 and the antenna terminal 20. The high-frequency module 1 further includes a mount substrate 300 (see FIG. 6).

Figure 6:
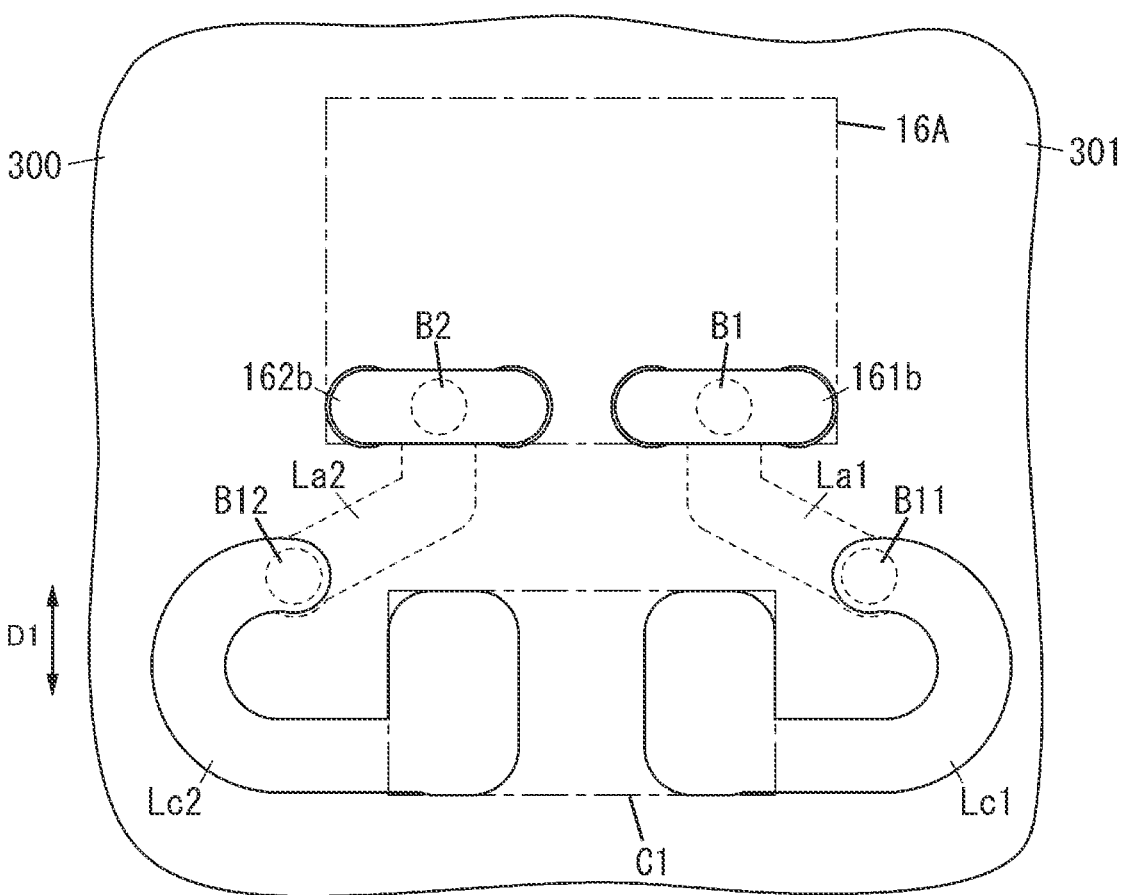
FIG. 6 is a plan view illustrating a configuration example of a plurality of inductors included in the series circuit.

The mount substrate 300 includes a main surface 301 (see FIG. 6). Circuit components included in the high-frequency circuit 10 are mounted on the main surface 301 of the mount substrate 300. Herein, "circuit components are mounted on the main surface 301 of the mount substrate 300" encompasses placement (mechanical connection) of the circuit components on the mount substrate 300 and electrical connection of the circuit components to (an appropriate conductor portion of) the mount substrate 300. In the high-frequency module 1, therefore, the plurality of circuit components are each placed on the main surface 301 of the mount substrate 300. The plurality of circuit components are not limited only to electronic components to be mounted on the mount substrate 300 but may include circuit elements to be provided in the mount substrate 300.

The mount substrate 300 is a printed wiring board, a low temperature co-fired ceramics (LTCC) substrate, a high temperature co-fired ceramics (HTCC) substrate, or a resin multilayer substrate, for instance. Herein, the mount substrate 300 is a multilayer substrate including a plurality of dielectric layers and a plurality of conductive layers, for instance. The plurality of dielectric layers and the plurality of conductive layers are stacked in a thickness direction of the mount substrate 300. The plurality of conductive layers are formed in specified patterns prescribed for the respective layers. The plurality of conductive layers each includes one conductor portion or a plurality of conductor portions in a plane that is orthogonal to the thickness direction of the mount substrate 300. Material of the conductive layers is copper, for instance. The plurality of conductive layers include a ground layer. In the high-frequency module 1, one or more ground terminals included in a plurality of outer connection terminals and the ground layer are electrically connected with a via conductor or the like, included in the mount substrate 300, interposed therebetween.

The mount substrate 300 is not limited to a printed wiring board or an LTCC substrate, but may be a wiring structure. The wiring structure is a multilayer structure, for instance. The multilayer structure includes at least one insulating layer and at least one conductive layer. The insulating layer is formed in a specified pattern. In case where there are a plurality of insulating layers, the plurality of insulating layers are formed in specified patterns prescribed for the respective layers. The conductive layer is formed in a specified pattern that differs from the specified pattern of the insulating layer. In case where there are a plurality of conductive layers, the plurality of conductive layers are formed in specified patterns prescribed for the respective layers. The conductive layer may include one rewiring portion or a plurality of rewiring portions. The wiring structure may be an interposer, for instance. The interposer may be an interposer in which a silicon substrate is used or a substrate made of multiple layers.

Meanwhile, minute irregularities or a recessed portion or a protruding portion may be formed on the main surface 301 of the mount substrate 300. In a plan view from the thickness direction of the mount substrate 300, the mount substrate 300 is rectangular but may be square, for instance, without necessarily being limited thereto.

As illustrated in FIG. 1, the antenna terminal 20 is electrically connected to the antenna 3.

As illustrated in FIG. 1, the high-frequency circuit 10 includes a switch 11, a first matching circuit 12, a second matching circuit 13, a transmission filter 14, a reception filter 15, a differential amplifier circuit 16, a third matching circuit 17, and a low-noise amplifier 18.

The switch 11 is a switch for switching of a connection destination of the antenna terminal 20. As illustrated in FIG. 1, the switch 11 includes a common terminal 111 and a plurality of (two in an illustrated example) selection terminals 112 and 113. The switch 11 selects at least one of the selection terminals 112 and 113 as a connection destination of the common terminal 111, under control of the signal processing circuit 2. The common terminal 111 is electrically connected to the antenna terminal 20. That is, the common terminal 111 is electrically connected to the antenna 3 with the antenna terminal 20 interposed therebetween. Incidentally, connection of the common terminal 111 is not limited to direct connection to the antenna 3. A filter, a coupler, or the like may be provided between the common terminal 111 and the antenna terminal 20. The selection terminal 112 is electrically connected to the first matching circuit 12. The selection terminal 113 is electrically connected to the second matching circuit 13. The switch 11 is configured so as to make a connection between the antenna terminal 20 and at least one matching circuit of the first matching circuit 12 and the second matching circuit 13, under the control of the signal processing circuit 2.

The first matching circuit 12 matches impedance between the transmission filter 14 and the antenna terminal 20. The first matching circuit 12 is made of one inductor, for instance, but may include a plurality of inductors and a plurality of capacitors, for instance, without necessarily being limited thereto.

The second matching circuit 13 matches impedance between the reception filter 15 and the antenna terminal 20. The second matching circuit 13 is made of one inductor, for instance, but may include a plurality of inductors and a plurality of capacitors, for instance, without necessarily being limited thereto.

The transmission filter 14 is an acoustic wave filter, for instance, and a plurality of serial arm resonators and a plurality of parallel arm resonators are each made of an acoustic wave resonator. The acoustic wave filter is a surface acoustic wave (SAW) filter for which surface acoustic waves are utilized, for instance. Incidentally, the transmission filter 14 is not limited to the SAW filter. The transmission filter 14 may be a bulk acoustic wave (BAW) filter, for instance, other than the SAW filter. Alternatively, the transmission filter 14 may be made of a film bulk acoustic resonator (FBAR) or the like. Alternatively, the transmission filter 14 may be made of an LC resonant circuit or the like.

The transmission filter 14 allows passage therethrough of high-frequency signals (transmission signals) to be transmitted from the antenna 3. The transmission filter 14 allows the passage of the transmission signals in a frequency band included in a mid-high band, for instance. In the embodiment, the transmission filter 14 allows the passage of the transmission signals in a communication band specified in 4G as the transmission signals in the frequency band. The communication band is Band4 specified in 4G, for instance. That is, the transmission signals are signals in the frequency band having the transmission band of 1710 MHz to 1755 MHz.

The reception filter 15 is an acoustic wave filter, for instance, and a plurality of serial arm resonators and a plurality of parallel arm resonators are each made of an acoustic wave resonator. The acoustic wave filter is a SAW filter for which surface acoustic waves are utilized, for instance. Incidentally, the reception filter 15 is not limited to the SAW filter. The reception filter 15 may be a BAW filter, for instance, other than the SAW filter. Alternatively, the reception filter 15 may be made of a FBAR or the like. Alternatively, the reception filter 15 may be made of an LC resonant circuit or the like.

The reception filter 15 allows passage therethrough of high-frequency signals (reception signals) received by the antenna 3. The reception filter 15 allows the passage of the reception signals in a frequency band included in the mid-high band, for instance. In the embodiment, the reception filter 15 allows the passage of the transmission signals in a communication band specified in 4G as the transmission signals in the frequency band. Herein, the communication band is Band4 specified in 4G, for instance. That is, the reception signals are signals in the frequency band having the reception band of 2110 MHz to 2155 MHz.

The differential amplifier circuit 16 carries out differential amplification of signals (transmission signals) received from the signal processing circuit 2 and attenuates a harmonic component (second-order harmonic component, third-order harmonic component, or the like). Detailed configurations of the differential amplifier circuit 16 will be described later.

The third matching circuit 17 matches impedance between the reception filter 15 and the low-noise amplifier 18. The third matching circuit 17 is made of one inductor, for instance, but may include a plurality of inductors and a plurality of capacitors, for instance, without necessarily being limited thereto.

The low-noise amplifier 18 amplifies the reception signals. An input terminal of the low-noise amplifier 18 is electrically connected to the reception filter 15. An output terminal of the low-noise amplifier 18 is electrically connected to the signal processing circuit 2. That is, the reception signals received by the antenna 3 are inputted into the low-noise amplifier 18 via the reception filter 15. The reception signals amplified by the low-noise amplifier 18 are outputted from the low-noise amplifier 18 to the signal processing circuit 2.

(3) Communication Device

As illustrated in FIG. 1, the communication device 500 according to the embodiment includes the high-frequency module 1, the signal processing circuit 2, and the antenna 3. The signal processing circuit 2 carries out signal processing for signals that pass through the high-frequency module 1. The signal processing circuit 2 includes a baseband signal processing circuit 201 and an RF signal processing circuit 202.

As illustrated in FIG. 1, the baseband signal processing circuit 201 is a baseband integrated circuit (BBIC), for instance, and is electrically connected to the RF signal processing circuit 202. The baseband signal processing circuit 201 generates I-phase signals and Q-phase signals from baseband signals. The baseband signal processing circuit 201 carries out IQ modulation processing by synthesizing the I-phase signals and the Q-phase signals and outputs the transmission signals. At this time, the transmission signals are generated as modulated signals resulting from amplitude modulation of carrier signals having a specified frequency with a period longer than a period of the carrier signals.

As illustrated in FIG. 1, the RF signal processing circuit 202 is a radio frequency integrated circuit (RFIC), for instance, and is provided between the high-frequency module 1 and the baseband signal processing circuit 201. The RF signal processing circuit 202 has a function of carrying out signal processing for the transmission signals from the baseband signal processing circuit 201 and a function of carrying out signal processing for the reception signals received by the antenna 3. The RF signal processing circuit 202 is a multiband-capable processing circuit and is capable of generating and amplifying the transmission signals in a plurality of communication bands.

Incidentally, in the communication device 500, the baseband signal processing circuit 201 is an optional component.

(4) Differential Amplifier Circuit

Figure 2:
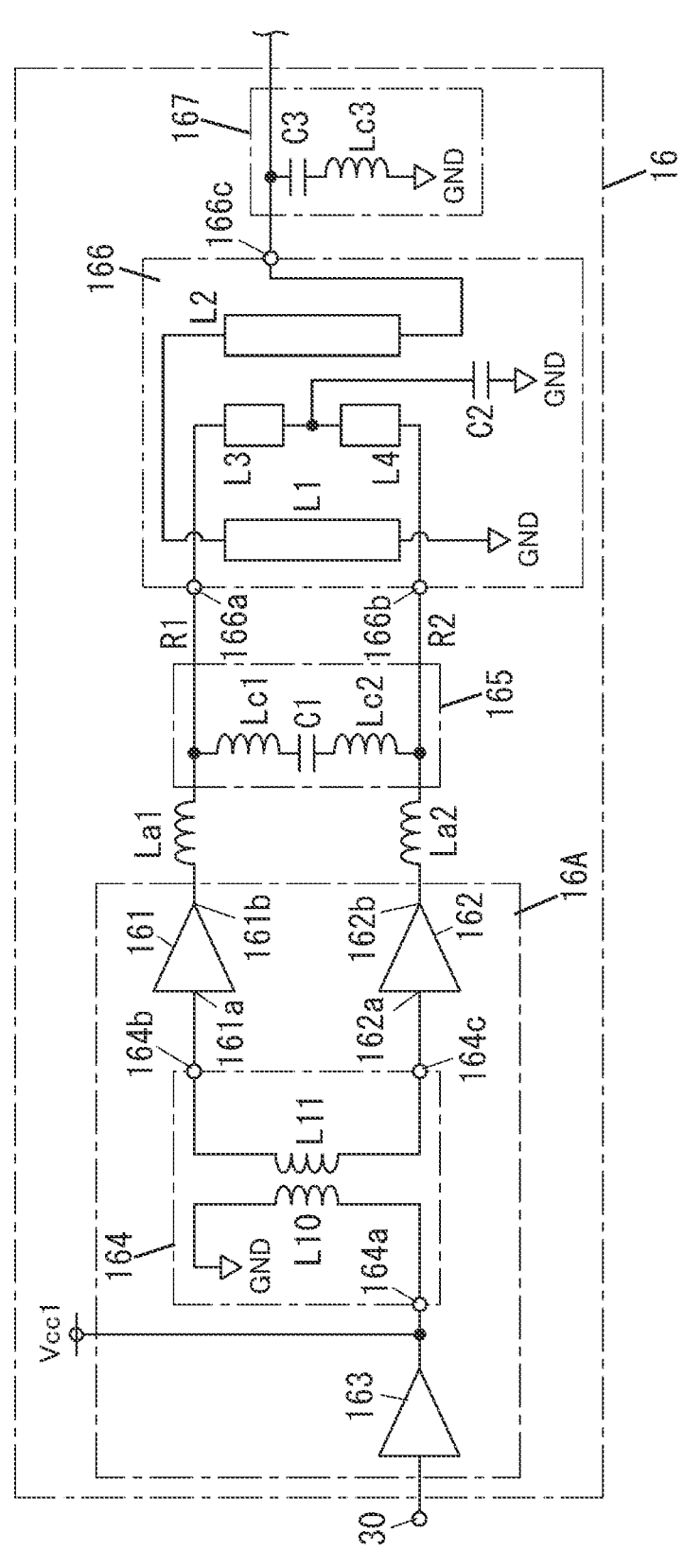
FIG. 2 is a circuit diagram illustrating a configuration of a differential amplifier circuit included in the high-frequency circuit.

The differential amplifier circuit 16 is included in the high-frequency circuit 10. As illustrated in FIG. 2, the differential amplifier circuit 16 includes a differential amplifier 16A, a series circuit 165, an output matching circuit 166, and a serial resonance circuit 167. As illustrated in FIG. 2, the differential amplifier 16A includes a first amplifying element 161, a second amplifying element 162, a third amplifying element 163, an interstage balun circuit 164, first wiring R1, and second wiring R2. The differential amplifier 16A is made of one chip. That is, the first amplifying element 161, the second amplifying element 162, the third amplifying element 163, and the interstage balun circuit 164 are made into one chip.

The third amplifying element 163 includes an input terminal and an output terminal. The input terminal of the third amplifying element 163 is electrically connected to the RF signal processing circuit 202 (see FIG. 1) of the signal processing circuit 2. The output terminal of the third amplifying element 163 is electrically connected to the interstage balun circuit 164. The third amplifying element 163 amplifies the high-frequency signals (transmission signals) outputted from the RF signal processing circuit 202 of the signal processing circuit 2 and outputs the high-frequency signals to the interstage balun circuit 164. A voltage Vcc1 is applied to the output terminal of the third amplifying element 163. That is, the transmission signals outputted from the signal processing circuit 2 are amplified in the third amplifying element 163 in a state in which the voltage Vcc1 is applied to the third amplifying element 163.

The interstage balun circuit 164 includes an unbalanced terminal 164a and a pair of balanced terminals 164b and 164c. The unbalanced terminal 164a is electrically connected to the output terminal of the third amplifying element 163. That is, the unbalanced terminal 164a is electrically connected to the signal processing circuit 2 with the third amplifying element 163 interposed therebetween. The balanced terminal 164b is electrically connected to the first amplifying element 161 and the balanced terminal 164c is electrically connected to the second amplifying element 162.

The interstage balun circuit 164 further includes a primary coil L10 and a secondary coil L11. One end of the primary coil L10 is electrically connected to the unbalanced terminal 164a. The other end of the primary coil L10 is electrically connected to ground. One end of the secondary coil L11 is electrically connected to the balanced terminal 164b and the other end of the secondary coil L11 is electrically connected to the balanced terminal 164c. Incidentally, the primary coil L10 and the secondary coil L11 may be formed of conductor pattern portions.

The high-frequency signals (transmission signals) outputted from the RF signal processing circuit 202 and amplified by the third amplifying element 163 are inputted into the unbalanced terminal 164a. The interstage balun circuit 164 carries out unbalanced-balanced transformation for the signals inputted into the unbalanced terminal 164a, outputs one signal of two signals having phases inverted to each other (two signals having phases shifted by 180 degrees relative to each other) to the first amplifying element 161, and outputs the other signal to the second amplifying element 162.

The first amplifying element 161 and the second amplifying element 162 each includes a heterojunction bipolar transistor (HBT) as a bipolar transistor, for instance.

The first amplifying element 161 includes a first input terminal 161a and a first output terminal 161b. The first input terminal 161a of the first amplifying element 161 is electrically connected to the balanced terminal 164b of the interstage balun circuit 164. The first output terminal 161b of the first amplifying element 161 is electrically connected to the output matching circuit 166 with the first wiring R1 interposed therebetween. The first amplifying element 161 amplifies the signals outputted from the balanced terminal 164b and outputs the signals to the output matching circuit 166.

The second amplifying element 162 includes a second input terminal 162a and a second output terminal 162b. The second input terminal 162a of the second amplifying element 162 is electrically connected to the balanced terminal 164c of the interstage balun circuit 164. The second output terminal 162b of the second amplifying element 162 is electrically connected to the output matching circuit 166 with the second wiring R2 interposed therebetween. The second amplifying element 162 amplifies the signals outputted from the balanced terminal 164c and outputs the signals to the output matching circuit 166.

The first wiring R1 is formed of a conductor pattern portion. One end of the first wiring R1 is electrically connected to the first output terminal 161b of the first amplifying element 161. The other end of the first wiring R1 is electrically connected to the output matching circuit 166.

The second wiring R2 is formed of a conductor pattern portion. One end of the second wiring R2 is electrically connected to the second output terminal 162b of the second amplifying element 162. The other end of the second wiring R2 is electrically connected to the output matching circuit 166.

The series circuit 165 is electrically connected between the first wiring R1 and the second wiring R2. The series circuit 165 includes an inductor Lc1 (first inductor), an inductor Lc2 (second inductor), and a capacitor C1 (first capacitor). The capacitor C1 is a chip capacitor, for instance. The inductor Lc1 and the inductor Lc2 are formed of conductor pattern portions. Inductance values of the inductor Lc1 and the inductor Lc2 are identical. The inductor Lc1 and the inductor Lc2 are mounted (placed) so as to be in line symmetry with respect to a specified axis, for instance. Thus, the inductance values of the inductor Lc1 and the inductor Lc2 can be made identical. Herein, "inductance values of the inductor Lc1 and the inductor Lc2 are identical" encompasses presence of the inductance value of the inductor Lc2 in ±20% range based on the inductance value of the inductor Lc1, other than complete coincidence between the inductance value of the inductor Lc1 and the inductance value of the inductor Lc2.

One end of the inductor Lc1 is electrically connected to the first wiring R1. The other end of the inductor Lc1 is connected to one end of the capacitor C1. The other end of the capacitor C1 is electrically connected to one end of the inductor Lc2. The other end of the inductor Lc2 is electrically connected to the second wiring R2. The series circuit 165 is not connected to the ground.

The series circuit 165 is a serial resonance circuit having an above configuration and attenuates an odd-order harmonic component, such as a third-order harmonic component, of a frequency of the transmission signals. The series circuit 165 attenuates harmonic components between a first value that is three times a lower limit of a communication band to which the transmission signals belong and a second value that is three times an upper limit of the communication band. For instance, the series circuit 165 attenuates a harmonic component of three times a center frequency of the communication band as a reference. That is, the series circuit 165 attenuates the harmonic component of three times the frequency of the transmission signals among the signals outputted from the first amplifying element 161. Further, the series circuit 165 attenuates the harmonic component of three times the frequency of the transmission signals among the signals outputted from the second amplifying element 162. That is, the series circuit 165 can be said to be a bypass circuit to bypass the harmonic components passing through the first wiring R1 and the second wiring R2 into the series circuit 165. Moreover, in other words, the series circuit 165 can be said to be an attenuation circuit because the series circuit 165 attenuates the harmonic components passing through the first wiring R1 and the second wiring R2.

The output matching circuit 166 is a so-called balun circuit. The output matching circuit 166 matches impedance between the differential amplifier 16A and the transmission filter 14. The output matching circuit 166 includes a plurality of (four in the illustrated example) inductors L1, L2, L3, and L4 and a capacitor C2 and configures a balun circuit. The output matching circuit 166 further includes a pair of balanced terminals 166a and 166b and an unbalanced terminal 166c. The inductors L1, L2, L3, and L4 are formed of conductor pattern portions. Incidentally, the inductors L1, L2, L3, and L4 may be chip inductors or the like.

The balanced terminal 166a is electrically connected to the first output terminal 161b of the first amplifying element 161 with the first wiring R1 interposed therebetween. The balanced terminal 166b is electrically connected to the second output terminal 162b of the second amplifying element 162 with the second wiring R2 interposed therebetween. The unbalanced terminal 166c is electrically connected to the serial resonance circuit 167 and the transmission filter 14.

The inductor L1 and the inductor L2 are serially connected. One end of the inductor L1 is electrically connected to the ground. The other end of the inductor L1 is electrically connected to one end of the inductor L2. The other end of the inductor L2 is electrically connected to the unbalanced terminal 166c. The inductor L3 and the inductor L4 are serially connected. One end of the inductor L3 is electrically connected to the balanced terminal 166a. The other end of the inductor L3 is electrically connected to one end of the inductor L4. The other end of the inductor L4 is electrically connected to the balanced terminal 166b. One end of the capacitor C2 is electrically connected to a point (such as midpoint) between the inductor L3 and the inductor L4. The other end of the capacitor C2 is electrically connected to the ground.

In the output matching circuit 166, the signals outputted from the first amplifying element 161 and the signals outputted from the second amplifying element undergo impedance transformation, while a state in which the phases are inverted is maintained. Thus, output impedance of the differential amplifier 16A undergoes impedance matching with input impedance of the transmission filter 14. The transmission signals having undergone the impedance matching are inputted into the transmission filter 14.

The serial resonance circuit 167 has one end electrically connected to the unbalanced terminal 166c and has the other end electrically connected to the ground. The serial resonance circuit 167 includes a capacitor C3 (second capacitor) and an inductor Lc3. The inductor Lc3 is formed of a conductor pattern portion. One end of the capacitor C3 is electrically connected to the unbalanced terminal 166c. The other end of the capacitor C3 is electrically connected to one end of the inductor Lc3. The other end of the inductor Lc3 is electrically connected to the ground. Incidentally, the inductor Lc3 may be a chip inductor or the like.

The serial resonance circuit 167 attenuates an even-order harmonic component, such as a second-order harmonic component, of the frequency of the transmission signals. The serial resonance circuit 167 attenuates harmonic components between a third value that is two times the lower limit of the communication band to which the transmission signals belong and a fourth value that is two times the upper limit of the communication band. For instance, the serial resonance circuit 167 attenuates a harmonic component of two times the center frequency of the communication band as the reference. That is, the serial resonance circuit 167 attenuates the harmonic component of two times the frequency of the transmission signals among the signals outputted from the output matching circuit 166.

As illustrated in FIG. 2, the differential amplifier circuit 16 further includes a plurality of (two in the illustrated example) inductors La1 (third inductor) and La2 (fourth inductor). The inductor La1 and the inductor La2 are formed of conductor pattern portions. Inductance values of the inductor La1 and the inductor La2 are identical. The inductor La1 and the inductor La2 are mounted (placed) so as to be in line symmetry with respect to a specified axis, for instance. Thus, the inductance values of the inductor La1 and the inductor La2 can be made identical. Herein, "inductance values of the inductor La1 and the inductor La2 are identical" encompasses presence, based on the inductance value of one (such as the inductor La1) of the inductors La1 and La2, of the inductance value of the other (such as the inductor La2) in ±20% range, other than complete coincidence between the inductance value of the inductor La1 and the inductance value of the inductor La2.

The inductor La1 is connected between the first output terminal 161b and the first wiring R1. The inductor La2 is connected between the second output terminal 162b and the second wiring R2. The inductors La1 and La2 regulate a phase of the harmonic component (harmonic component of three times (third order) the frequency of the transmission signals). Specifically, the inductors La1 and La2 regulate the phase of the harmonic component in an open direction.

(5) Effects

As described above, the high-frequency circuit 10 according to the embodiment includes the differential amplifier circuit 16. The differential amplifier circuit 16 includes the first amplifying element 161, the second amplifying element 162, the first wiring R1, the second wiring R2, and the series circuit 165. The first amplifying element 161 includes the first input terminal 161a and the first output terminal 161b. The second amplifying element 162 includes the second input terminal 162a and the second output terminal 162b. The first wiring R1 is connected to the first output terminal 161b. The second wiring R2 is connected to the second output terminal 162b. The series circuit 165 is connected between the first wiring R1 and the second wiring R2. The series circuit 165 includes the first inductor (inductor Lc1), the second inductor (inductor Lc2), and the capacitor C1.

According to this configuration, in case where the series circuit 165 is a serial resonance circuit, a harmonic component of the transmission signals in the differential amplification, such as the third-order harmonic component of the frequency of the transmission signals, can be attenuated.

Figure 3:
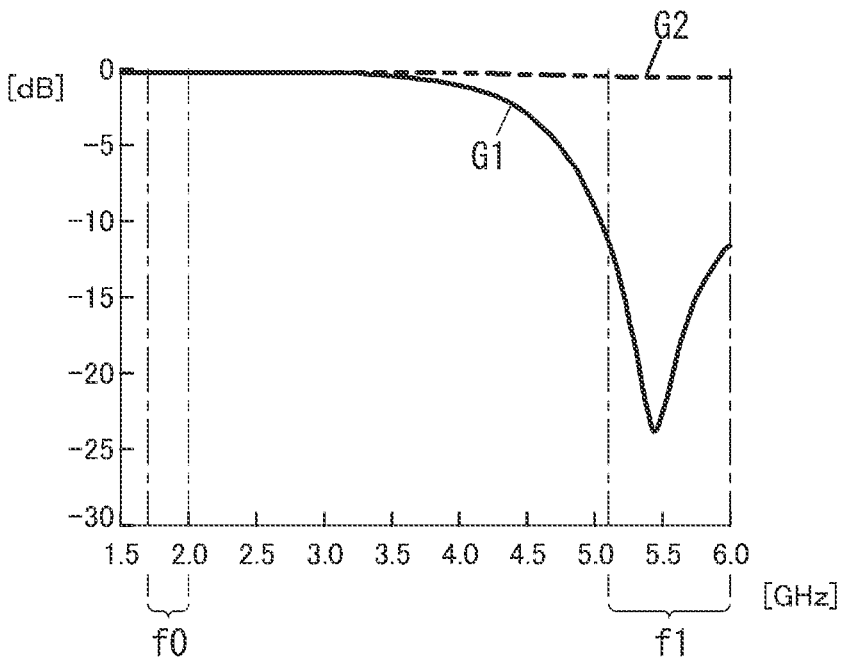
FIG. 3 is a diagram illustrating frequency characteristics of the high-frequency circuit.

Herein, frequency characteristics of the high-frequency circuit 10 including the series circuit 165 and a high-frequency circuit including no serial resonance circuit are illustrated in FIG. 3. A frequency band f0 illustrated in FIG. 3 is a band to which the frequency of the transmission signals belongs. A frequency band f1 illustrated in FIG. 3 is a frequency band that is three times the frequency band f0. That is, the frequency band f1 includes a third-order frequency of the frequency of the transmission signals. A solid line represents the frequency characteristics G1 of the high-frequency circuit 10 including the series circuit 165. A dashed line represents the frequency characteristics G2 of the high-frequency circuit including no serial resonance circuit. Incidentally, the second-order harmonic component of the frequency of the transmission signals is not mentioned in FIG. 3.

In the high-frequency circuit 10 of the embodiment, as apparent from the frequency characteristics G1, the signals are not attenuated in the frequency band f0, while the signals are attenuated in the frequency band f1. On the other hand, in the high-frequency circuit including no serial resonance circuit, the signals are not attenuated in both the frequency band f0 and the frequency band f1, as apparent from the frequency characteristics G2.

Therefore, the high-frequency circuit 10 of the embodiment is capable of carrying out a satisfactory communication, compared with the high-frequency circuit including no serial resonance circuit.

Meanwhile, the series circuit 165 is connected between the first wiring R1 and the second wiring R2. Compared with a case where a circuit (resonance circuit) to attenuate a harmonic component is provided in wiring, the high-frequency circuit 10 of the embodiment is capable of reducing loss of the transmission signals due to the resonance circuit.

Moreover, the high-frequency circuit 10 of the embodiment further includes the third inductor (inductor La1) and the fourth inductor (inductor La2). The third inductor is connected between the first output terminal 161b and the first wiring R1. The fourth inductor is connected between the second output terminal 162b and the second wiring R2.

According to this configuration, the phase of the third-order harmonic component of the frequency of the transmission signals can be regulated in the open direction.

Figure 4A:
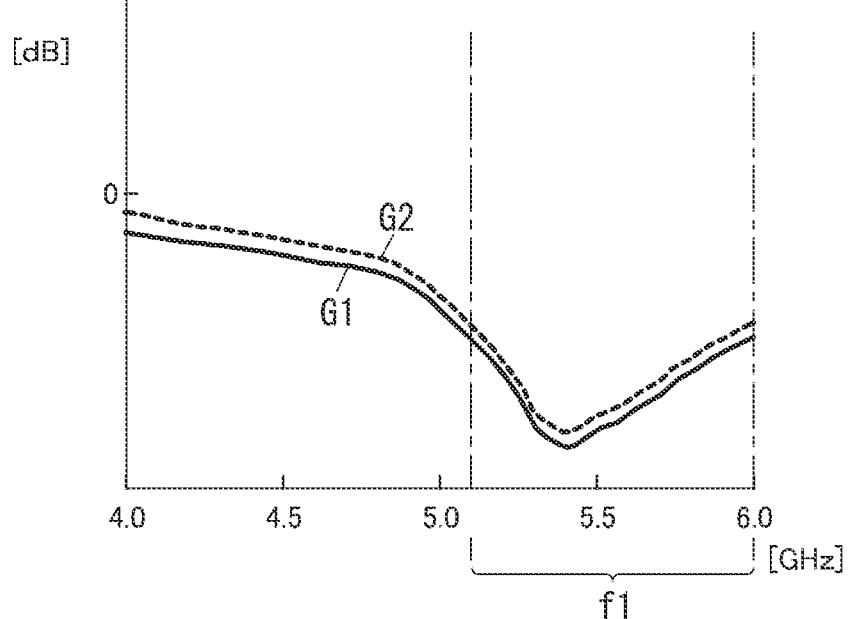
FIG. 4A is a diagram illustrating frequency characteristics obtained from provision of a series circuit in the high-frequency circuit.

Herein, frequency characteristics of the high-frequency circuit 10 (high-frequency circuit 10 of the embodiment)

including the series circuit 165, the third inductor, and the fourth inductor and a high-frequency circuit not including the third inductor and the fourth inductor are illustrated in FIG. 4A. The frequency characteristics of the high-frequency circuit 10 of the embodiment and the high-frequency circuit (high-frequency circuit of a comparative example) not including the third inductor and the fourth inductor are illustrated in FIG. 4A. Herein, the high-frequency circuit of the comparative example includes a resonance circuit to attenuate the third-order harmonic component of the frequency of the transmission signals. FIG. 4A is a diagram representing the frequency characteristics in the frequency band f1. Incidentally, the second-order harmonic component of the frequency of the transmission signals is not mentioned in FIG. 4A.

Figure 4B:
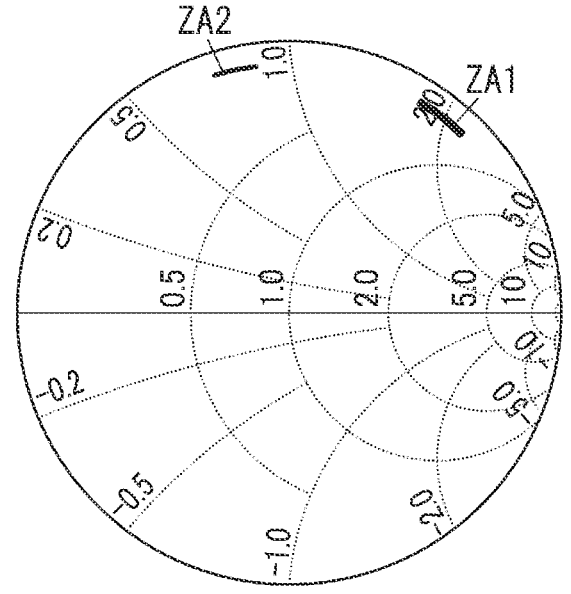
FIG. 4B is a Smith chart illustrating phases of a harmonic component in the high-frequency circuit.

Meanwhile, a Smith chart representing the phases of the third-order harmonic component of the frequency of the transmission signals in each of the high-frequency circuit 10 of the embodiment and the high-frequency circuit of the comparative example is illustrated in FIG. 4B.

ZA1 illustrated in FIG. 4B denotes the phase in the third-order frequency of the frequency of the transmission signals in the high-frequency circuit 10 of the embodiment. ZA2 illustrated in FIG. 4B denotes the phase in the third-order frequency of the frequency of the transmission signals in the high-frequency circuit of the comparative example.

As apparent from FIG. 4A, the frequency characteristics of the high-frequency circuit 10 of the embodiment and the high-frequency circuit of the comparative example are substantially identical. That is, both the high-frequency circuit 10 of the embodiment and the high-frequency circuit of the comparative example attenuate the third-order harmonic component of the frequency of the transmission signals.

Meanwhile, as apparent from FIG. 4B, the phase of the third-order harmonic component of the frequency of the transmission signals in the high-frequency circuit 10 of the embodiment is positioned on an open side, compared with the phase of the third-order harmonic component of the frequency of the transmission signals in the high-frequency circuit of the comparative example. That is, the high-frequency circuit is capable of regulating the phase of the third-order harmonic component of the frequency of the transmission signals in the open direction by including the third inductor and the fourth inductor.

Furthermore, the differential amplifier circuit 16 of the high-frequency circuit 10 of the embodiment includes the serial resonance circuit 167. The serial resonance circuit 167 has the one end connected to the unbalanced terminal 166c. The serial resonance circuit 167 includes the capacitor C2, different from the capacitor C1 of the series circuit 165, and the inductor Lc3.

According to this configuration, the harmonic component for the transmission signals in the differential amplification, such as the second-order harmonic component of the frequency of the transmission signals, can be attenuated.

Figure 5:
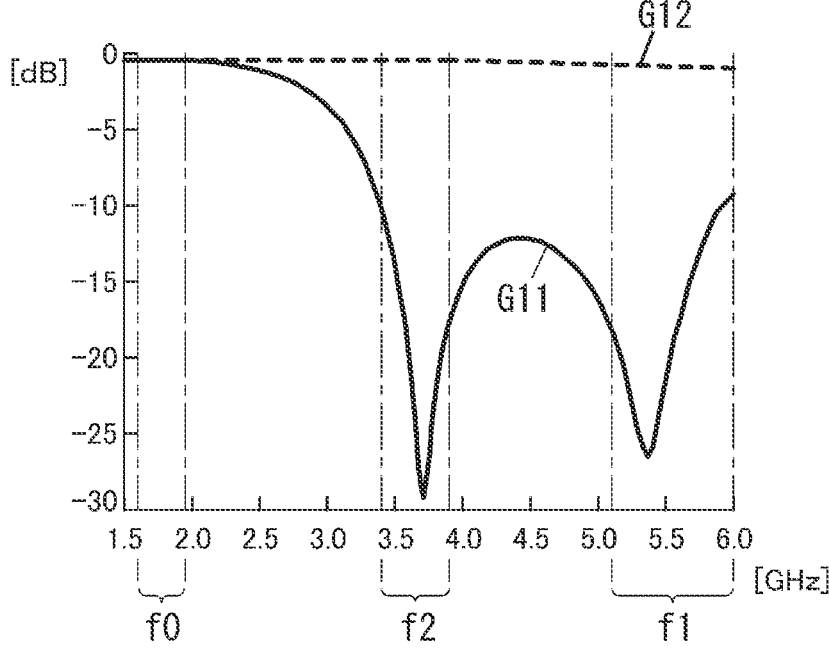
FIG. 5 is a diagram illustrating frequency characteristics obtained from provision of the series circuit and a serial resonance circuit in the high-frequency circuit.

Herein, frequency characteristics of the high-frequency circuit 10 including the series circuit 165 and the serial resonance circuit 167 (to be simply referred to as the high-frequency circuit 10 below) and a high-frequency circuit including no serial resonance circuit (high-frequency circuit of another comparative example) are illustrated in FIG. 5. The frequency band f0 illustrated in FIG. 5 is the band to which the frequency of the transmission signals belongs. The frequency band f1 illustrated in FIG. 5 is the frequency band that is three times the frequency band f0. That is, the frequency band f1 includes the frequency that is three times the frequency of the transmission signals. A frequency band f2 illustrated in FIG. 5 is a frequency band that is two times the frequency band f0. That is, the frequency band f2 includes a frequency that is two times the frequency of the transmission signals. A solid line represents the frequency characteristics G11 of the high-frequency circuit 10. A dashed line represents the frequency characteristics G12 of the high-frequency circuit of another comparative example.

In the high-frequency circuit 10, as apparent from the frequency characteristics G11, the signals are not attenuated in the frequency band f0, while the signals are attenuated in the frequency band f1 and the frequency band f2. On the other hand, in the high-frequency circuit of another comparative example, the signals are not attenuated in any frequency band of the frequency band f0, the frequency band f1, and the frequency band f2, as apparent from the frequency characteristics G12.

Therefore, the high-frequency circuit 10 is capable of carrying out a satisfactory transmission, compared with the high-frequency circuit of another comparative example.

(6) Specific Example

Herein, specific examples of structures of the inductors Lc1, Lc2, La1, and La2 will be described with use of FIGS. 6 to 7B.

Figure 7A:
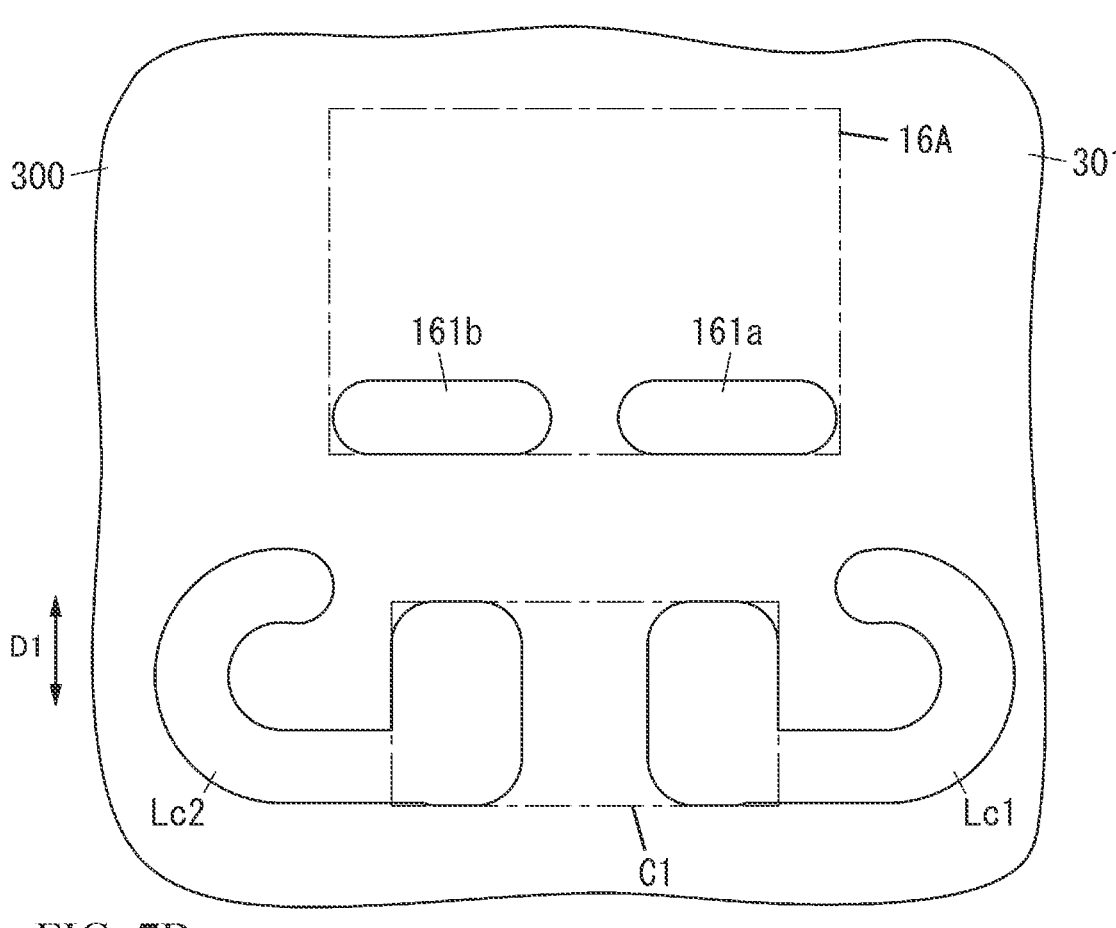
FIGS. 7A and 7B are plan views illustrating configuration examples of layers where the plurality of inductors included in the series circuit are placed.
Figure 7B:
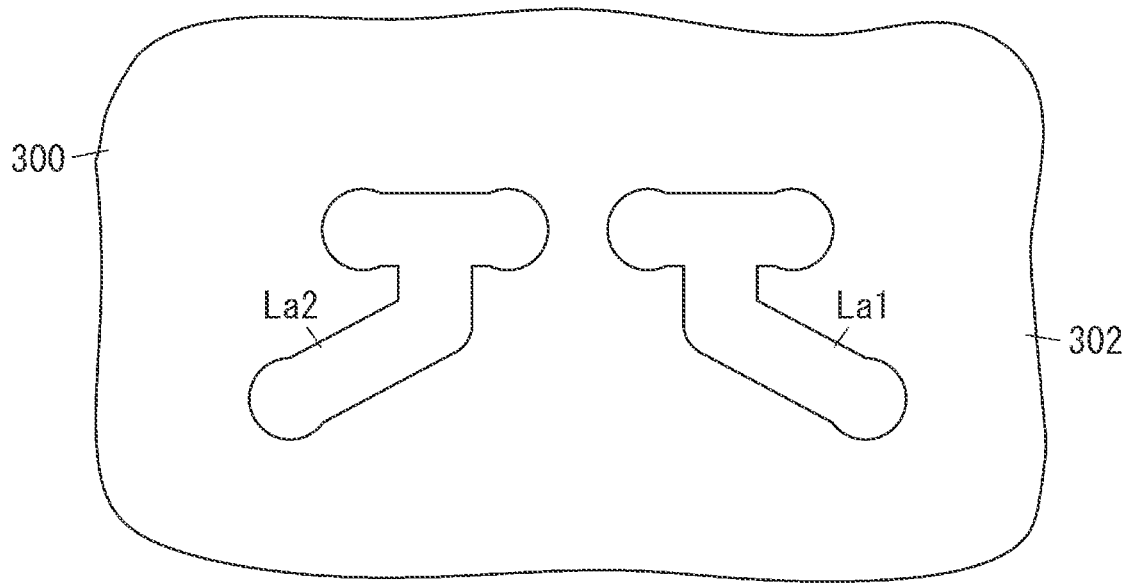

As illustrated in FIGS. 6 and 7A, the first output terminal 161b and the second output terminal 162b of the differential amplifier 16A, the inductors Lc1 and Lc2, and the capacitor C1 are mounted on the main surface 301 of the mount substrate 300. The inductors Lc1 and Lc2 are placed as the conductor pattern portions on the main surface 301 of the mount substrate 300. As illustrated in FIG. 7B, the inductors La1 and La2 are placed as the conductor pattern portions on a dielectric layer 302 in the mount substrate 300.

The first output terminal 161b and the inductor La1 are electrically connected with a via B1 interposed therebetween. The second output terminal 162b and the inductor La2 are electrically connected with a via B2 interposed therebetween. The inductor La1 and the inductor Lc1 are electrically connected with a via B11 interposed therebetween. The inductor La2 and the inductor Lc2 are electrically connected with a via B12 interposed therebetween.

The inductor Lc1 and the inductor Lc2 are placed in line symmetry with respect to an axis extending through a center of the capacitor C1 and along a direction D1, in the plan view from the thickness direction of the mount substrate 300. A difference in impedance between the first output terminal 161b and the second output terminal 162b can be decreased by placement of the inductor Lc1 and the inductor Lc2 in line symmetry with respect to the axis extending through the center of the capacitor C1 and along the direction D1. That is, the inductance values of the inductor Lc1 and the inductor Lc2 can be made identical.

The inductor La1 and the inductor La2 are placed in line symmetry with respect to the axis extending through the center of the capacitor C1 and along the direction D1, in the plan view from the thickness direction of the mount substrate 300. A difference in impedance between the first output terminal 161b and the second output terminal 162b can be decreased by placement of the inductor La1 and the inductor La2 in line symmetry with respect to the axis extending through the center of the capacitor C1 and along the direction D1. The inductance values of the inductor La1 and the inductor La2 can be made identical.

Incidentally, though the inductor Lc1 and the inductor Lc2 are configured so as to be placed on the main surface 301 of the mount substrate 300 in the embodiment, there is no limitation to this configuration. The inductor Lc1 and the inductor Lc2 may be placed as conductor pattern portions on a dielectric layer in the mount substrate 300. Alternatively, a chip inductor may be mounted as the inductor Lc1 in or on the mount substrate 300. Similarly, a chip inductor may be mounted as the inductor Lc2 in or on the mount substrate 300.

Though the inductor La1 and the inductor La2 are configured so as to be placed as the conductor pattern portions on the dielectric layer 302 in the mount substrate 300, there is no limitation to this configuration. The inductor La1 and the inductor La2 may be placed as conductor pattern portions on the main surface 301. Alternatively, a chip inductor may be mounted as the inductor La1 in or on the mount substrate 300. Similarly, a chip inductor may be mounted as the inductor La2 in or on the mount substrate 300.

Though a configuration is provided in the embodiment in which the first output terminal 161*b* and the second output terminal 162*b* are placed on a surface closer to the mount substrate 300 of two surfaces of the differential amplifier 16A that are opposed to each other in the thickness direction of the mount substrate 300, there is no limitation to this configuration. A configuration may be used in which the first output terminal 161*b* and the second output terminal 162*b* are placed on a surface farther from the mount substrate 300 of the two surfaces of the differential amplifier 16A that are opposed to each other in the thickness direction of the mount substrate 300. In this case, the inductors La1 and La2 may be configured by wire bonding.

(7) Modification

Hereinbelow, modifications of the embodiment will be described.

(7.1) Modification 1

The inductors La1 and La2 are optional components of the high-frequency circuit 10. Even in case where the high-frequency circuit 10 does not include the inductors La1 and La2, the harmonic component for the transmission signals can be attenuated as illustrated in FIG. 4A, providing that the high-frequency circuit 10 includes the series circuit 165, as described above.

A structure of the inductors Lc1 and Lc2 in modification 1 will be described with use of FIG. 8.

Figure 8:
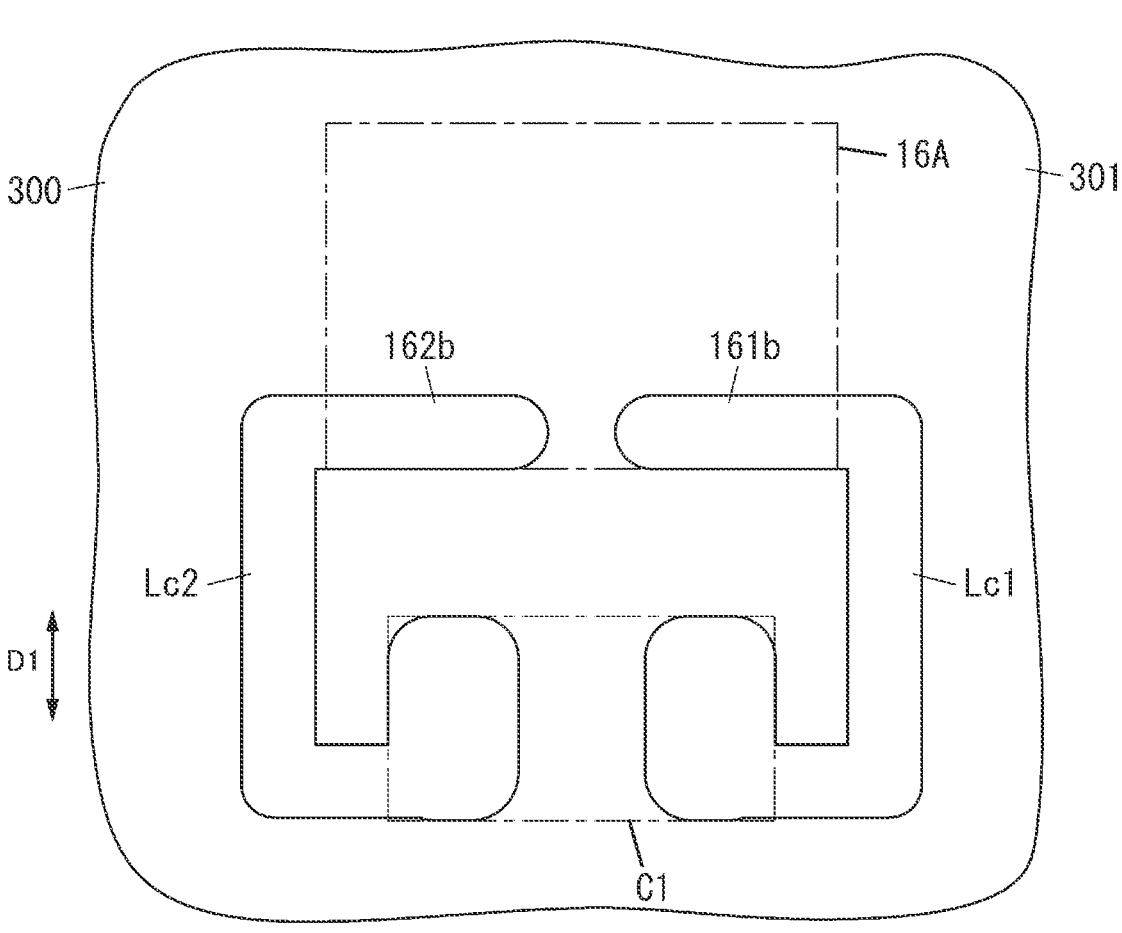
FIG. 8 is a plan view illustrating a configuration example of a plurality of inductors included in a series circuit of modification 1 according to the embodiment.

The first output terminal 161*b* and the second output terminal 162*b* of the differential amplifier 16A, the inductors Lc1 and Lc2, and the capacitor C1 are mounted on the main surface 301 of the mount substrate 300 as illustrated in FIG. 8. The inductors Lc1 and Lc2 are placed as conductor pattern portions on the main surface 301 of the mount substrate 300.

The first output terminal 161*b* and the inductor Lc1 are electrically connected. The second output terminal 162*b* and the inductor Lc2 are electrically connected.

The inductor Lc1 and the inductor Lc2 are placed in line symmetry with respect to the axis extending through the center of the capacitor C1 and along the direction D1, in the plan view from the thickness direction of the mount substrate 300. The difference in impedance between the first output terminal 161*b* and the second output terminal 162*b* can be decreased by placement of the inductor Lc1 and the inductor Lc2 in line symmetry with respect to the axis extending through the center of the capacitor C1 and along the direction D1. That is, the inductance values of the inductor Lc1 and the inductor Lc2 can be made identical.

Incidentally, though the inductor Lc1 and the inductor Lc2 are configured so as to be placed on the main surface 301 of the mount substrate 300 in modification 1, there is no limitation to this configuration. The inductor Lc1 and the inductor Lc2 may be placed as conductor pattern portions on a dielectric layer in the mount substrate 300. Alternatively, a chip inductor may be mounted as the inductor Lc1 in or on the mount substrate 300. Similarly, a chip inductor may be mounted as the inductor Lc2 in or on the mount substrate 300.

Though the configuration is provided in modification 1 in which the first output terminal 161*b* and the second output terminal 162*b* are placed on the surface closer to the mount substrate 300 of the two surfaces of the differential amplifier 16A that are opposed to each other in the thickness direction of the mount substrate 300, there is no limitation to this configuration. The configuration may be used in which the first output terminal 161*b* and the second output terminal 162*b* are placed on the surface farther from the mount substrate 300 of the two surfaces of the differential amplifier 16A that are opposed to each other in the thickness direction of the mount substrate 300. In this case, the inductors La1 and La2 may be configured by wire bonding.

(7.2) Modification 2

A circuit mounted between the third amplifying element 163 and the first and second amplifying elements 161 and 162 is not limited to the interstage balun circuit 164. It is sufficient if a circuit that generates two signals having phases inverted to each other from one signal is provided between the third amplifying element 163 and the first and second amplifying elements 161 and 162.

(7.3) Modification 3

Though the high-frequency circuit 10 is used for the communication in the mid-band frequency band, there is no limitation thereto. The high-frequency circuit 10 may be used for communication in a low-band frequency band or may be used for communication in a high-band frequency band. Alternatively, the high-frequency circuit 10 may be used for ultra-high-band communication.

(7.4) Modification 4

Though the transmission filter 14 is configured so as to allow the passage therethrough of the one communication band, there is no limitation to this configuration. The transmission filter 14 may be configured so as to allow passage therethrough of a plurality of communication bands.

The series circuit 165 in modification 4 attenuates high-frequency signals between a first value that is three times the smallest lower limit among lower limits of the plurality of communication bands and a second value that is three times the greatest upper limit among upper limits of the plurality of communication bands.

(7.5) Modification 5

(7.5.1) First Standpoint

A modification at a standpoint with a view of the mount substrate 300 from an arrangement direction D1 (direction D1) will be described with use of FIGS. 9A to 9C. Herein, the arrangement direction D1 is a direction in which the output matching circuit 166 and the differential amplifier 16A are arranged, in the plan view from the thickness direction of the mount substrate 300.

In the view, from the arrangement direction D1, of the mount substrate 300, that is, the differential amplifier 16A, the output matching circuit 166, and the capacitor C1 included in the series circuit 165, the capacitor C1 may be placed on the mount substrate 300 so that a first portion that is at least a portion of the capacitor C1 overlaps with the output matching circuit 166 and so that a second portion that is at least a portion of the capacitor C1 overlaps with the differential amplifier 16A.

Figures 9A, 9B, 9C:
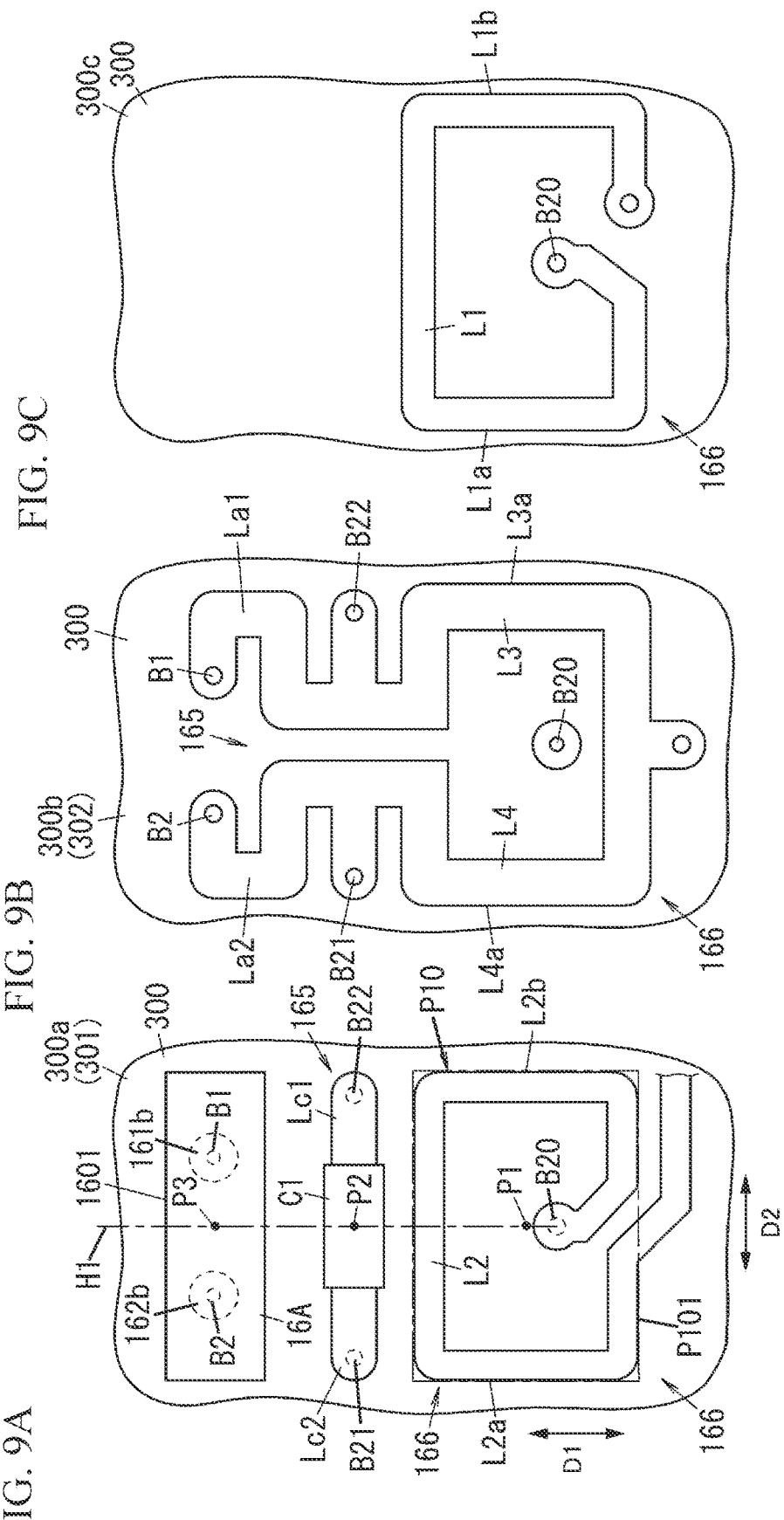
FIGS. 9A to 9C are diagrams representing relation of placement in a high-frequency circuit of modification 5 according to the embodiment.

As illustrated in FIGS. 9A to 9C, for instance, the mount substrate 300 is a multilayer substrate and includes a first layer 300a, a second layer 300b, and a third layer 300c.

The first layer 300a includes the main surface 301, and the differential amplifier 16A, the capacitor C1 and the inductors Lc1 and Lc2 of the series circuit 165, and the inductor L2 of the output matching circuit 166 are placed on the first layer 300a (see FIG. 9A). The inductors Lc1 and Lc2 and the inductor L2 are each placed as a conductor pattern portion. The second layer 300b is an underlying layer for the first layer 300a and corresponds to the dielectric layer 302 described above. On the second layer 300b, the inductors La1 and La2 of the series circuit 165 and the inductors L3 and L4 of the output matching circuit 166 are placed (see FIG. 9B). The inductors La1 and La2 and the inductors L3 and L4 are each placed as a conductor pattern portion. The third layer 300c is an underlying layer for the second layer 300b, and the inductor L1 of the output matching circuit 166 is placed on the third layer 300c (see FIG. 9C). The inductor L1 is placed as a conductor pattern portion. A stacking direction for the first layer 300a, the second layer 300b, and the third layer 300c is the thickness direction of the mount substrate 300.

The inductor L2 and the inductor L1 are electrically connected with a via B20 interposed therebetween by stacking of the first layer 300a, the second layer 300b, and the third layer 300c. Further, the inductor Lc2, the inductor L4, and the inductor La2 are electrically connected with a via B21 interposed therebetween by the stacking of the first layer 300a, the second layer 300b, and the third layer 300c. Furthermore, the inductor Lc1, the inductor L3, and the inductor La1 are electrically connected with a via B22 interposed therebetween by the stacking of the first layer 300a, the second layer 300b, and the third layer 300c. The first output terminal 161b and the inductor La1 are electrically connected with the via B1 interposed therebetween. The second output terminal 162b and the inductor La2 are electrically connected with the via B2 interposed therebetween.

In the view from the arrangement direction D1, in this state, at least the portion (second portion) of the capacitor C1 overlaps with the differential amplifier 16A (see FIG. 9A).

Further, at least the portion (first portion) of the capacitor C1 overlaps with the output matching circuit 166 in the view from the arrangement direction D1. Specifically, at least the portion (first portion) of the capacitor C1 overlaps with the inductor L2 of the output matching circuit 166 in the view from the arrangement direction D1. That is, at least the portion (first portion) of the capacitor C1 is provided between two outer edges L2a and L2b of the inductor L2 that extend in the arrangement direction D1, in the view from the arrangement direction D1.

Further, the first portion of the capacitor C1 may be between the inductors L3 and L4 of the output matching circuit 166 in the view from the arrangement direction D1. That is, the first portion of the capacitor C1 may be provided between an outer edge L3a of the inductor L3 and an outer edge L4a of the inductor L4, in the view from the arrangement direction D1. Alternatively, the first portion of the capacitor C1 may overlap with the inductor L1 of the output matching circuit 166 in the view from the arrangement direction D1. That is, the first portion of the capacitor C1 may be provided between two outer edges L1a and L1b of the inductor L1 that extend in the arrangement direction D1, in the view from the arrangement direction D1.

Incidentally, the capacitor C1 may overlap with at least one of the output matching circuit 166 and the differential amplifier 16A in the view from the arrangement direction D1. In the first standpoint of modification 5, as illustrated in FIG. 9A, the capacitor C1 overlaps with both of the output matching circuit 166 and the differential amplifier 16A in the view of the mount substrate 300 from the arrangement direction D1.

Furthermore, the output matching circuit 166, the capacitor C1, and the differential amplifier 16A may be placed so that a center P2 of the capacitor C1 is aligned with at least one center of a center P1 of the output matching circuit 166 and a center P3 of the differential amplifier 16A along the arrangement direction D1 in the plan view from the thickness direction of the mount substrate 300. Herein, the center P2 of the capacitor C1 is aligned with the center P1 of the output matching circuit 166 and the center P3 of the differential amplifier 16A along the arrangement direction D1 in the plan view from the thickness direction of the mount substrate 300. More particularly, the center P2 of the capacitor C1, the center P1 of the output matching circuit 166, and the center P3 of the differential amplifier 16A exist on a straight line H1 along the arrangement direction D1 in the plan view from the thickness direction of the mount substrate 300. Herein, the center P1 of the output matching circuit 166 refers to a center of a rectangular area of the output matching circuit 166. Similarly, the center P2 of the capacitor C1 refers to a center of a rectangular area of the capacitor C1. Further, the center P3 of the differential amplifier 16A refers to a center of a rectangular area of the differential amplifier 16A.

In the first standpoint of modification 5, it is sufficient if the capacitor C1 is placed on the mount substrate 300 so that at least a portion of the capacitor C1 overlaps with the output matching circuit 166 and so that at least a portion of the capacitor C1 overlaps with the differential amplifier 16A, in the view from the arrangement direction D1. Therefore, order of arrangement of the output matching circuit 166, the series circuit 165, and the differential amplifier 16A in the arrangement direction D1 is not specified. That is, the capacitor C1, that is, the series circuit 165 is configured so as to be placed between the differential amplifier 16A and the output matching circuit 166 with respect to the arrangement direction D1 in FIGS. 9A to 9C, whereas there is no limitation to this configuration. The output matching circuit 166 may be placed between the series circuit 165 and the differential amplifier 16A with respect to the arrangement direction D1. Alternatively, the differential amplifier 16A may be placed between the series circuit 165 and the output matching circuit 166 with respect to the arrangement direction D1.

According to the first standpoint of modification 5, the capacitor C1 is placed on the mount substrate 300 so that at least the portion of the capacitor C1 overlaps with the output matching circuit 166 and so that at least the portion of the capacitor C1 overlaps with the differential amplifier 16A, in the view from the arrangement direction D1. According to this configuration, a length of the inductor La1 and the inductor Lc1 and a length of the inductor La2 and the inductor Lc2 between the differential amplifier 16A and the capacitor C1 can be balanced. That is, the length of the inductor La1 and the inductor Lc1 and the length of the inductor La2 and the inductor Lc2 between the differential amplifier 16A and the capacitor C1 can be made identical. Thus, a combined value (coupling amount) of inductance of the inductor La1 and the inductor Lc1 and a combined value (coupling amount) of inductance of the inductor La2 and the inductor Lc1 can be balanced. As a result, stabilization of operation during communication can be forwarded. Herein, the length of the inductor La1 and the inductor Lc1 refers to a length from the first output terminal 161*b* to the capacitor C1. The length of the inductor La2 and the inductor Lc2 refers to a length from the second output terminal 162*b* to the capacitor C1.

Though the inductors L1 to L4 of the output matching circuit 166 are each configured so as to be formed of the conductor pattern portion in the first standpoint of modification 5, there is no limitation to this configuration. The inductors L1 to L4 may be each formed of a chip inductor. Alternatively, the output matching circuit 166 may be made into one chip.

(7.5.2) Second Standpoint

A modification from a standpoint with a view from a direction D2 orthogonal to both of the thickness direction of the mount substrate 300 and the arrangement direction D1 of the output matching circuit 166 and the differential amplifier 16A will be described.

In the view from the direction D2, the capacitor C1 included in the series circuit 165 may be placed on the mount substrate 300 and between an outer edge 1601 farther from the output matching circuit 166 of two outer edges of the differential amplifier 16A along the direction D2 and an outer edge P101 farther from the differential amplifier 16A of two outer edges of the output matching circuit 166 along the direction D2 (see FIG. 9A). Herein, the outer edge P101 is a side, farther from the output matching circuit 166, of two sides of a smallest rectangle P10 enclosing the inductor L2 that extend along the direction D2.

Further, in the view from the direction D2, the capacitor C1 may be placed on the mount substrate 300 and between an outer edge that is a side, farther from the output matching circuit 166, of two sides of a smallest rectangle enclosing the inductors L3 and L4, the two sides extending along the direction D2, and the outer edge P101 of the differential amplifier 16A. Further, in the view of the mount substrate 300 from the direction D2, the capacitor C1 may be placed on the mount substrate 300 and between an outer edge that is a side, farther from the output matching circuit 166, of two sides of a smallest rectangle enclosing the inductor L1 that extend along the direction D2 and the outer edge P101 of the differential amplifier 16A.

In the second standpoint of modification 5, the capacitor C1 is placed between the output matching circuit 166 and the differential amplifier 16A in the plan view from the thickness direction of the mount substrate 300 (see FIG. 9A). In this case, in the view from the direction D2, the capacitor C1 is placed between the outer edge 1601 of the differential amplifier 16A and the outer edge P101 of the output matching circuit 166 and is placed so as not to overlap with either of the differential amplifier 16A and the output matching circuit 166. That is, the capacitor C1 is placed between an outer edge, closer to the output matching circuit 166, of the two outer edges of the differential amplifier 16A along the direction D2 and an outer edge, closer to the differential amplifier 16A, of the two outer edges of the output matching circuit 166 along the direction D2, in the view from the direction D2.

In the second standpoint of modification 5, it is sufficient if the capacitor C1 is placed between the outer edge (such as the outer edge P101), farther from the differential amplifier 16A, of the two outer edges of the output matching circuit 166 along the second direction and the outer edge 1601 of the differential amplifier 16A, in the view from the direction D2. Therefore, relation of placement among the capacitor C1, the output matching circuit 166, and the differential amplifier 16A in the view of the mount substrate 300 from the arrangement direction D1 is not specified. That is, at least a portion of the capacitor C1 does not have to overlap with the output matching circuit 166 in the view from the arrangement direction D1 in the second standpoint of modification 5. Furthermore, in the second standpoint of modification 5, at least a portion of the capacitor C1 does not have to overlap with the differential amplifier 16A.

According to the second standpoint of modification 5, the capacitor C1 is placed between the outer edge 1601 of the differential amplifier 16A and the outer edge P101 of the output matching circuit 166 in the view from the direction D2. Accordingly, lengths of the inductors La1 and La2 and lengths of the inductors Lc1 and Lc2 can be shortened, compared with a case where the capacitor C1 is placed on a side opposed to the differential amplifier 16A with respect to the outer edge P101 of the output matching circuit 166. That is, a path length between the first output terminal 161*b* and the capacitor C1 and a path length between the second output terminal 162*b* and the capacitor C1 can be shortened. Thus, the inductance values of the inductors La1 and La2 can be decreased. Additionally, the inductance values of the inductors Lc1 and Lc2 can be decreased. As a result, errors with respect to impedance values of impedance design for the high-frequency circuit 10 can be decreased.

Though the inductors L1 to L4 of the output matching circuit 166 are each configured so as to be formed of the conductor pattern portion in the second standpoint of modification 5, there is no limitation to this configuration. The inductors L1 to L4 may be each formed of a chip inductor, as with the first standpoint of modification 5. Alternatively, the output matching circuit 166 may be made into one chip.

Overview

As described above, the high-frequency circuit (10) of a first aspect includes the differential amplifier circuit (16). The differential amplifier circuit (16) includes the first amplifying element (161), the second amplifying element (162), the first wiring (R1), the second wiring (R2), and the series circuit (165). The first amplifying element (161) includes the first input terminal (161*a*) and the first output terminal (161*b*). The second amplifying element (162), the second input terminal (162*a*), and the second output terminal (162*b*) are provided. The first wiring (R1) is connected to the first output terminal (161*b*). The second wiring (R2) is connected to the second output terminal (162*b*). The series circuit (165) is connected between the first wiring (R1) and the second wiring (R2). The series circuit (165) includes the first inductor (such as the inductor Lc1), the second inductor (such as the inductor Lc2), and the capacitor (C1).

According to this configuration, in case where the series circuit (165) is a serial resonance circuit, a harmonic component for the transmission signals in the differential amplification, such as the odd-order (third-order, for instance) harmonic component of the frequency of the transmission signals, can be attenuated.

In the high-frequency circuit (10) of a second aspect, the differential amplifier circuit (16) further includes the third inductor (such as the inductor La1) and the fourth inductor (such as the inductor La2), in the first aspect. The third inductor is connected between the first output terminal (161b) and the first wiring (R1). The fourth inductor is connected between the second output terminal (162b) and the second wiring (R2).

According to this configuration, the phase of the harmonic component, such as the odd-order (third-order, for instance) harmonic component of the frequency of the transmission signals, can be regulated.

In the high-frequency circuit (10) of a third aspect, the inductance values of the third inductor and the fourth inductor are identical, in the second aspect.

According to this configuration, the difference in impedance between the first output terminal (161b) and the second output terminal (162b) can be decreased.

In the high-frequency circuit (10) of a fourth aspect, the inductance values of the first inductor and the second inductor are identical, in any of the first to third aspects.

According to this configuration, the difference in impedance between the first output terminal (161b) and the second output terminal (162b) can be decreased.

In the high-frequency circuit (10) of a fifth aspect, the capacitor (C1) is a chip capacitor, in any of the first to fourth aspects.

According to this configuration, Q value of the capacitor (C1) can be increased. Therefore, attenuation of the harmonic component can be increased. Further, an effect of improvement in insertion loss can be expected.

In the high-frequency circuit (10) of a sixth aspect, the differential amplifier circuit (16) further includes the balun circuit (such as the output matching circuit 166), in any of the first to fifth aspects. The balun circuit includes the pair of balanced terminals (166a, 166b) that are each connected to the first wiring (R1) and the second wiring (R2) and the unbalanced terminal (166c).

According to this configuration, signals having the odd-order harmonic component in the differential amplification attenuated can be outputted, for instance.

In the high-frequency circuit (10) of a seventh aspect, the differential amplifier circuit (16) further includes the serial resonance circuit (167), in the sixth aspect. The serial resonance circuit (167) has the one end connected to the unbalanced terminal (166c). The serial resonance circuit (167) includes the second capacitor (such as the capacitor C2), different from the first capacitor made of the capacitor (C1) of the series circuit (165), and the inductor (Lc3).

According to this configuration, in case where the serial resonance circuit (167) is used as a resonance circuit, a harmonic component for the transmission signals in the differential amplification, such as the even-order (second-order, for instance) harmonic component of the frequency of the transmission signals, can be attenuated.

The high-frequency circuit (10) of an eighth aspect further includes the mount substrate (300), in any of the first to seventh aspects. The differential amplifier circuit (16) includes the differential amplifier (16A) and the output matching circuit (166). The differential amplifier (16A) includes the first amplifying element (161) and the second amplifying element (162). The differential amplifier (16A), the output matching circuit (166), and the capacitor (C) included in the series circuit (165) are placed on the mount substrate (300). The output matching circuit (166) is connected to the first output terminal (161b) and the second output terminal (162b). In the view from the arrangement direction (D1) of the output matching circuit (166) and the differential amplifier (16A), the first portion that is at least a portion of the capacitor (C1) included in the series circuit (165) overlaps with the output matching circuit (166) and the second portion that is at least a portion of the capacitor (C1) overlaps with the differential amplifier (16A).

According to this configuration, a balance between the length from the first output terminal (161b) to the capacitor (C1) and the length from the second output terminal (162b) to the capacitor (C1) can be regulated. As a result, the stabilization of the operation during communication can be forwarded.

In the high-frequency circuit (10) of a ninth aspect, the capacitor (C1) overlaps with at least one of the output matching circuit (166) and the differential amplifier (16A) in the view from the arrangement direction (D1), in the eighth aspect.

According to this configuration, the operation during communication can be further stabilized.

In the high-frequency circuit (10) of a tenth aspect, the center (P2) of the capacitor (C1) is aligned with the center of at least one of the output matching circuit (166) and the differential amplifier (16A) along the arrangement direction (D1) in the plan view from the thickness direction of the mount substrate (300), in the eighth or ninth aspect.

According to this configuration, the length from the first output terminal (161b) to the capacitor (C1) and the length from the second output terminal (162b) to the capacitor (C1) can be made identical. As a result, the stabilization of the operation during communication can be forwarded.

The high-frequency circuit (10) of an eleventh aspect further includes the mount substrate (300), in any of the first to tenth aspects. The differential amplifier circuit (16) includes the differential amplifier (16A) and the output matching circuit (166). The differential amplifier (16A) includes the first amplifying element (161) and the second amplifying element (162). The output matching circuit (166) is connected to the first output terminal (161b) and the second output terminal (162b). The differential amplifier (16A), the output matching circuit (166), and the capacitor (C1) included in the series circuit (165) are placed on the mount substrate (300). In the view from the second direction (such as the direction D2) orthogonal to both of the thickness direction of the mount substrate (300) and the first direction that is the arrangement direction (D1) of the output matching circuit (166) and the differential amplifier (16A), the capacitor (C1) included in the series circuit (165) is placed on the mount substrate (300) and between the outer edge (P101), farther from the differential amplifier (16A), of the two outer edges of the output matching circuit (166) along the second direction and the outer edge (1601), farther from the output matching circuit (166), of the two outer edges of the differential amplifier (16A) along the second direction.

According to this configuration, the path length between the first output terminal (161b) and the capacitor (C1) and the path length between the second output terminal (162b) and the capacitor (C1) can be shortened. That is, the inductance value of a path between the first output terminal (161b) and the capacitor (C1) and the inductance value of a path between the second output terminal (162b) and the capacitor (C1) can be decreased. As a result, the errors with respect to the impedance values of the impedance design for the high-frequency circuit (10) can be decreased.

In the high-frequency circuit (10) of a twelfth aspect, the capacitor (C1) is placed between the output matching circuit (166) and the differential amplifier (16A) in the plan view of the mount substrate (300) from the thickness direction of the mount substrate (300), in the eleventh aspect.

According to this configuration, as a result, the errors with respect to the impedance values of the impedance design for the high-frequency circuit (10) can be further decreased.

The communication device (500) of a thirteenth aspect includes the high-frequency circuit (10) of any of the first to twelfth aspects and the signal processing circuit (2) to which the high-frequency circuit (10) is connected.

According to this configuration, a harmonic component for the transmission signals in the differential amplification, such as the odd-order (third-order, for instance) harmonic component of the frequency of the transmission signals, can be attenuated.

REFERENCE SIGNS LIST 1 high-frequency module
2 signal processing circuit
3 antenna
10 high-frequency circuit
11 switch
12 first matching circuit
13 second matching circuit
14 transmission filter
15 reception filter
16 differential amplifier circuit
16A differential amplifier
17 third matching circuit
18 low-noise amplifier
20 antenna terminal
111 common terminal
112 selection terminal
113 selection terminal
161 first amplifying element
161a first input terminal
161b first output terminal
162 second amplifying element
162a second input terminal
162b second output terminal
163 third amplifying element
164 interstage balun circuit
164a unbalanced terminal
164b, 164c balanced terminal
165 series circuit
166 output matching circuit (balun circuit)
166a, 166b balanced terminal
166c unbalanced terminal
167 serial resonance circuit
201 baseband signal processing circuit
202 RF signal processing circuit
300 mount substrate
300a first layer
300b second layer
300c third layer
301 main surface
302 dielectric layer
500 communication device
1601, L1a, L1b, L2a, L2b, L3a, L4a, P101 outer edge
B1, B2, B11, B12, B20, B21, B22 via
C1 capacitor (first capacitor)
C2 capacitor
C3 capacitor (second capacitor)
D1 arrangement direction (direction, first direction)

22

D2 direction (second direction)
H1 straight line
L1, L2, L3, L4 inductor
L10 primary coil
L11 secondary coil
Lc1 inductor (first inductor)
Lc2 inductor (second inductor)
Lc3 inductor
La1 inductor (third inductor)
La2 inductor (fourth inductor)
P1, P2, P3 center
P10 rectangle
R1 first wiring
R2 second wiring

The invention claimed is:

1. A high-frequency circuit comprising:
a differential amplifier circuit; and
a mount substrate, wherein:
the differential amplifier circuit comprises:
a first amplifying circuit element comprising a first input terminal and a first output terminal,
a second amplifying circuit element comprising a second input terminal and a second output terminal,
first wiring connected to the first output terminal,
second wiring connected to the second output terminal,
a series circuit connected between the first wiring and the second wiring, the series circuit comprising a first inductor, a second inductor, and a capacitor
a differential amplifier comprising the first amplifying circuit element and the second amplifying circuit element, and
an output matching circuit connected to the first output terminal and the second output terminal,
the differential amplifier, the output matching circuit, and the capacitor included in the series circuit are placed on the mount substrate, and
in a view from an arrangement direction of the output matching circuit and the differential amplifier, a first portion that is at least a portion of the capacitor included in the series circuit overlaps with the output matching circuit, and a second portion that is at least a portion of the capacitor included in the series circuit overlaps with the differential amplifier.

2. The high-frequency circuit according to claim 1, wherein
the differential amplifier circuit further comprises:
a third inductor connected between the first output terminal and the first wiring, and
a fourth inductor connected between the second output terminal and the second wiring.

3. The high-frequency circuit according to claim 2, wherein
an inductance value of the third inductor and an inductance value of the fourth inductor are identical.

4. The high-frequency circuit according to claim 1, wherein
an inductance values of the first inductor and an inductance value of the second inductor are identical.

5. The high-frequency circuit according to claim 1, wherein
the capacitor comprises a chip capacitor.

6. The high-frequency circuit according to claim 1, wherein
the differential amplifier circuit further comprises a balun circuit that includes a pair of balanced terminals that are each connected to the first wiring and the second wiring and an unbalanced terminal.

7. The high-frequency circuit according to claim 6, wherein the differential amplifier circuit further comprises a serial resonance circuit comprising a first end connected to the unbalanced terminal, and the serial resonance circuit comprises a second capacitor, the second capacitor being different from a first capacitor that is made of the capacitor of the series circuit, and an inductor.

8. A high-frequency circuit comprising:

a differential amplifier circuit; and a mount substrate, wherein:

the differential amplifier circuit comprises:

a first amplifying circuit element comprising a first input terminal and a first output terminal, a second amplifying circuit element comprising a second input terminal and a second output terminal, first wiring connected to the first output terminal, second wiring connected to the second output terminal, a series circuit connected between the first wiring and the second wiring, the series circuit comprising a first inductor, a second inductor, and a capacitor a differential amplifier comprising the first amplifying circuit element and the second amplifying circuit element, and an output matching circuit connected to the first output terminal and the second output terminal, the differential amplifier, the output matching circuit, and the capacitor included in the series circuit are placed on the mount substrate, and in a view from a second direction orthogonal to both of a thickness direction of the mount substrate and a first direction that is an arrangement direction of the output matching circuit and the differential amplifier, the capacitor included in the series circuit is placed on the mount substrate and between a first outer edge, farther from the differential amplifier, of two outer edges of the output matching circuit along the second direction and second outer edge, farther from the output matching circuit, of two outer edges of the differential amplifier along the second direction.

9. The high-frequency circuit according to claim 8, wherein the capacitor included in the series circuit is placed between the output matching circuit and the differential amplifier in a plan view from the thickness direction of the mount substrate.

10. A communication device comprising:

the high-frequency circuit according to claim 1; and a signal processing circuit that is connected to the high-frequency circuit.

11. The high-frequency circuit according to claim 2, wherein an inductance values of the first inductor and an inductance value of the second inductor are identical.

12. The high-frequency circuit according to claim 3, wherein an inductance values of the first inductor and an inductance value of the second inductor are identical.

13. The high-frequency circuit according to claim 2, wherein the capacitor comprises a chip capacitor.

14. The high-frequency circuit according to claim 3, wherein the capacitor comprises a chip capacitor.

15. The high-frequency circuit according to claim 4, wherein the capacitor comprises a chip capacitor.

16. The high-frequency circuit according to claim 2, wherein the differential amplifier circuit further comprises a balun circuit that includes a pair of balanced terminals that are each connected to the first wiring and the second wiring and an unbalanced terminal.

17. The high-frequency circuit according to claim 3, wherein the differential amplifier circuit further comprises a balun circuit that includes a pair of balanced terminals that are each connected to the first wiring and the second wiring and an unbalanced terminal.

18. The high-frequency circuit according to claim 1, wherein the capacitor included in the series circuit overlaps with at least one of the output matching circuit and the differential amplifier in the view from the arrangement direction.

19. The high-frequency circuit according to claim 1, wherein a center of the capacitor included in the series circuit is aligned with a center of at least one of the output matching circuit and the differential amplifier along the arrangement direction in a plan view from a thickness direction of the mount substrate.

* * * * *